United States Patent [19]

Moench et al.

[11] 4,250,410
[45] Feb. 10, 1981

[54] SPEED-UP CIRCUIT

[75] Inventors: Jerry D. Moench; Rodney C. Tesch, both of Austin, Tex.

[73] Assignee: Motorola, Inc., Schaumburg, Ill.

[21] Appl. No.: 15,836

[22] Filed: Feb. 27, 1979

[51] Int. Cl.³ .......................... H03K 5/12; H03K 3/26
[52] U.S. Cl. .................................. 307/263; 307/268; 307/279
[58] Field of Search .................. 307/268, 263, 279

[56] References Cited
U.S. PATENT DOCUMENTS

| 3,376,437 | 4/1968 | Weinstock | 307/268 |
| 3,519,849 | 7/1970 | Tyler | 307/263 |
| 4,129,792 | 12/1978 | Kawagai et al. | 307/263 |

Primary Examiner—Harold A. Dixon
Attorney, Agent, or Firm—Joe E. Barbee

[57] ABSTRACT

There is provided a circuit capable of speeding up a signal that has a positive slope, $dv/dt > 0$. The circuit detects or senses the slope, amplifies the slope and feeds back a signal to enforce the pull up of the positive going signal. The circuit is also capable of handling complementary signals and when the positive going signal is being pulled up its complement is pulled down. The positive going signal is capacitively coupled into the circuit.

12 Claims, 2 Drawing Figures

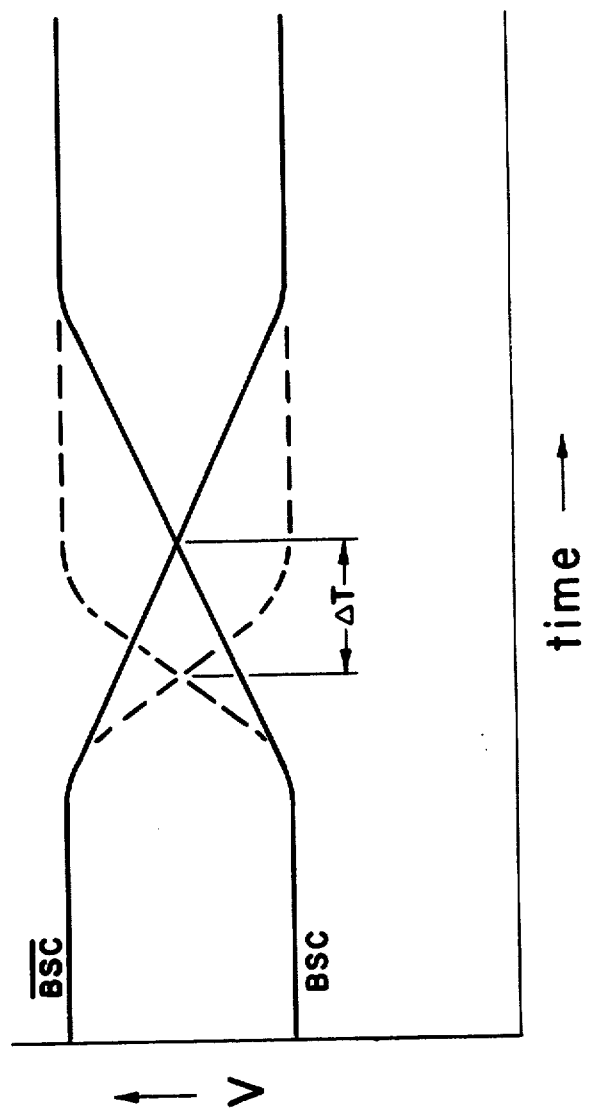

SPEED-UP CIRCUIT

This invention relates, in general, to speed-up circuits, and more particularly, to those speed-up circuit useful in speeding up bit sense signals in digital memories.

It is often desirable to speed-up the transition of a signal, especially, in high density integrated circuits such as random access memories (RAM). As the number of components on an integrated circuit chip increases, the capacitance of lines on the integrated circuit also increases. The capacitance on the lines tends to reduce the speed of the circuit by causing the signals on the lines to take longer to change voltage levels. On most static RAMs a pair of bit sense lines come from the array of storage cells through a column decoder to bit sense column (BSC and $\overline{BSC}$) lines. This pair of lines then goes to a sense amplifier which drives an output section. Voltage transitions on these BSC lines typically move very slowly due to the capacitance associated with the line. The signal on the BSC lines are complements of each other and must cross over before the sense amplifier can detect a change in voltage level of the signals on the BSC lines.

Many different high gain differential amplifiers could be used to detect the crossing of BSC and $\overline{BSC}$, however, the amplifier cannot start to generate a new output until after the BSC and $\overline{BSC}$ signals have crossed each other or at least approached each other quite closely. If a signal could be generated that could detect the start of the transition of the signal on the BSC lines, the operating speed of RAMs and/or ROM could be made much faster.

Accordingly, it is an object of the present invention to provide a circuit for speeding up the transition of a signal.

Another object of the present invention is to provide a speed-up circuit useful in digital memories for faster sensing of signals.

SUMMARY OF THE INVENTION

In carrying out the above and other objects and advantages of the present invention, there is provided a speed-up circuit useful for speeding up the transition of a signal. Means are provided for sensing a transition of a signal and for providing an output indicative of the transition. Capacitive means are used for coupling the transition from a line carrying the transition to the means for sensing. The output of the means for sensing is amplified through an amplifier and fed back to the line carrying the transition to reinforce the transition and thereby speed up the transition.

The present invention is particularly useful for speeding the transition of BSC and $\overline{BSC}$ signals on bit sense column lines.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 2 illustrates in graphic form advantages gained from the present invention.

DETAILED DESCRIPTION OF THE DRAWINGS

Figure 1:
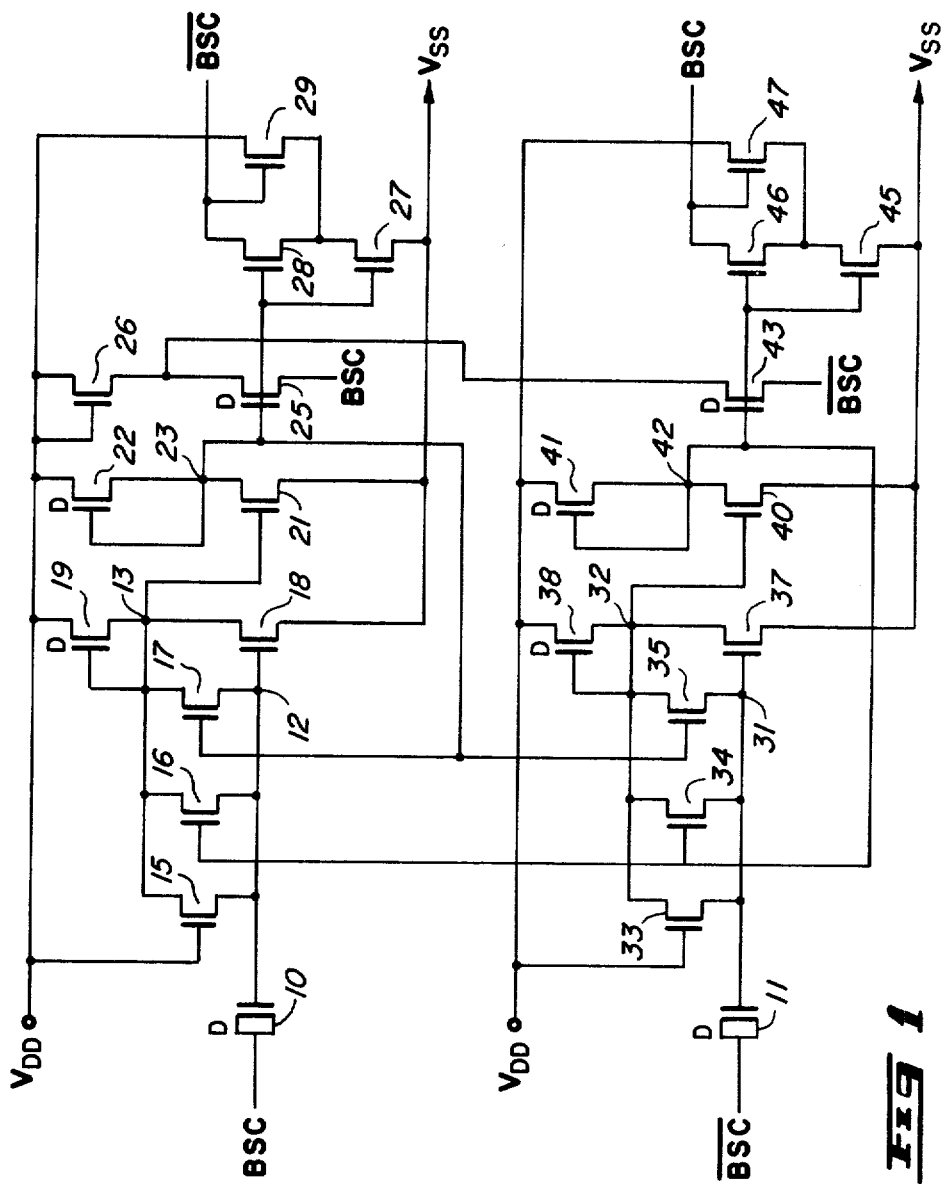
FIG. 1 is a schematic drawing of an embodiment of the present invention.

The present invention is illustrated in FIG. 1 as speeding up the transition of two complementary signals, BSC and $\overline{BSC}$ which are capacitively coupled into the speed-up circuit by capacitor 10 and capacitor 11, respectively. Capacitors 10 and 11 are preferably depletion type capacitors. The BSC signal is coupled by capacitor 10 to node 12, which is connected to a gate electrode of transistor 18. Transistor 18 is in series with a depletion type transistor 19. Transistors 18 and 19 serve as sensors for sensing a positive transition of the BSC signal and providing an output at node 13. There are three transistors 15, 16, and 17 in parallel with each other between nodes 12 and 13. Transistor 15 has its gate electrode connected to voltage terminal $V_{DD}$, which will enable transistor 15, thereby maintaining nodes 12 and 13 at the same potential when transistors 18 and 19 are in a non-sensing state. Node 13 is coupled to a gate electrode of transistor 21. Series connected transistors 21 and 22 serve as amplifiers for amplifying a signal at node 13 and provide an output at node 23. Transistor 22 is a depletion type transistor having its gate electrode connected to its source electrode forming node 23. The drain electrode of transistor 22 is coupled to voltage potential terminal $V_{DD}$, and the source electrode of transistor 21 is coupled to voltage potential terminal $V_{SS}$. Node 23 is connected to the gate electrode of depletion type transistor 25, to the gate electrode of transistor 17, to the gate electrode of transistor 35, and to the gate electrode of transistors 27 and 28. Transistor 25 has its drain electrode connected to a load device illustrated as transistor 26. Transistor 26 has its gate and drain electrodes coupled to voltage terminal $V_{DD}$. The source of transistor 25 is connected back to the same line carrying the input signal BSC.

Transistors 27 and 28 are in series between voltage potential terminal $V_{SS}$ and the $\overline{BSC}$ input line. Transistor 29 serves as a threshold adjust device and has its gate electrode connected to the drain electrode of transistor 28, its source electrode connected to the source electrode of transistor 28, and its drain electrode connected to voltage terminal $V_{DD}$.

When a transition on input line BSC starts to go positive, capacitor 10 couples the positive transition to node 12 which is connected to the gate electrode of transistor 18. Transistor 18 is enabled thereby driving node 13 low, towards voltage potential $V_{SS}$. As node 13 goes low, transistor 21 is disabled so that node 23 goes high. As node 23 goes high, transistor 17 is enabled thereby equalizing nodes 12 and 13, and bringing the circuit back to its stable operating point. Node 23 is also coupled to the gate electrode of depletion type transistor 25, and as node 23 goes high conduction of transistor 25 increases thereby applying the positive voltage from transistor 26 to input signal line BSC. As node 23 goes high transistors 27 and 28 are also enabled thereby driving the $\overline{BSC}$ signal line low. In summary, as capacitor 10 couples a positive going transition from BSC into the speed-up circuit, feedback transistor 25 becomes enabled thereby reinforcing the BSC signal by positive voltage while at the same time transistors 27 and 28 become enabled thereby reinforcing $\overline{BSC}$ with a low voltage.

The remaining portion of the circuitry of FIG. 1 monitors the $\overline{BSC}$ signal for positive transitions. The line carrying $\overline{BSC}$ is coupled by capacitor 11 to node 31.

Node 31 is coupled to the gate electrode of transistor 37. Transistors 37 and 38 are in series between voltage terminal $V_{SS}$ and voltage terminal $V_{DD}$ and serve as means for sensing a positive transition of $\overline{BSC}$. Transistor 38 is a depletion type transistor having its gate electrode connected to its source electrode at node 32. Three transistors 33, 34, and 35 are in parallel between nodes 31 and 32. Transistor 33 has its gate electrode connected to voltage terminal $V_{DD}$ and serves to equalize the potential between nodes 31 and 32 when transistors 37 and 38 are in a non-amplifying or non-sensing state. The gate electrode of transistor 35 is connected to node 23 and will become conductive when node 23 goes high. The purpose of transistor 35 is to equalize nodes 31 and 32 when node 23 is going high which means that BSC is experiencing a positive transition. Transistors 40 and 41, which are connected in series between voltage terminal $V_{SS}$ and voltage terminal $V_{DD}$, serve as an amplifier to amplify a signal at node 32. Node 32 is connected to the gate electrode of transistor 40, and depletion type transistor 41 has its gate electrode connected to its source electrode forming node 42. Node 42 is connected to the gate electrodes of transistors 34 and 16, the gate electrode of transistor 43, and the gate electrodes of transistors 45 and 46. As node 42 goes positive, in response to a positive going transition of $\overline{BSC}$, transistor 34 is enabled thereby equalizing nodes 31 and 32 and transistor 16 is enabled thereby equalizing nodes 12 and 13. When transistors 16, 34 or 17, 35 are enabled, the whole circuit is brought back to its stable operating point thereby making the circuit ready for any more transitions of BSC or $\overline{BSC}$.

As node 42 goes positive, depletion type transistor 43 is enabled thereby supplying a positive going pulse to the $\overline{BSC}$ line. Transistor 43 is supplied a positive voltage from its load device 26. Load device 26 along with transistor 25 form a feedback means for the BSC line while transistor 26 and transistor 43 form a feedback means for the $\overline{BSC}$ line. As node 42 goes high, transistors 45 and 46 are enabled thereby coupling the potential from terminal $V_{SS}$ to the BSC line thereby speeding up the decline of the signal on the BSC line. Transistor 47 has its source connected to the source of transistor 46, and its gate electrode connected to the drain electrode of transistor 46 and serves as a threshold adjust device for transistor 46. The drain electrode of transistor 47 is coupled to voltage terminal $V_{DD}$.

The operation of the speed-up circuit coupled by capacitor 11 to the $\overline{BSC}$ line is the same as the speed-up circuit coupled to the BSC line by capacitor 10. Capacitor 11 will couple a positive going transition from the $\overline{BSC}$ line to node 31 where it is sensed and amplified by transistors 37 and 38 and provides an output at node 32. The output from node 32 is amplified by transistors 40 and 41 and coupled by feedback means 43 to the $\overline{BSC}$ line to reinforce the $\overline{BSC}$ signal by positive voltage. At the same time transistors 45 and 46 reinforce the BSC signal by a low voltage.

The benefits derived from the circuit of FIG. 1 are graphically illustrated in the voltage versus time graph of FIG. 2. The solid BSC and $\overline{BSC}$ lines illustrate the normal crossover response of these signals without the benefit of the present invention. The dotted portion of the BSC and $\overline{BSC}$ lines illustrates the sharper crossover transition of the signals in response to the assistance of the present speed-up circuit. Note that the earlier crossover results in increased operating speed of the circuit.

The crossover transition is sharper and occurs $\Delta T$ sooner.

By now it should be appreciated that there has been provided a speed-up circuit which responds to an input signal having a positive slope, $dv/dt > 0$. When the slope is detected it is amplified and fed back to reinforce the pullup of the positive going signal. The circuit also has the capability of pulling down a signal which is a complement to the signal having the positive slope. Although the circuit has been illustrated as having a specific application for speeding up complementary BSC and $\overline{BSC}$ signals associated with digital memories it will be appreciated that the circuit is capable of speeding up any slow responding signal undergoing a voltage transition. However, the gain of the feedback loop must be chosen such that noise will not trip the circuit, yet, sensitive enough to trip when $\overline{BSC}$ or BSC is changing. The feedback pulldown of the opposite BSC line must be made such that if BSC is rising $\overline{BSC}$ is not pulled down so far that after the circuit resets itself, the BSC line rises and trips the opposite reaction.

We claim:

1. A speed-up circuit for speeding up a voltage transition on a first and a second conductor for carrying complementary signals, comprising: a first inverter having an input and an output, the input being coupled to the first conductor; a second inverter having an input and an output, the input of the second inverter being coupled to the output of the fist inverter; first, second and third field effect transistors coupled in parallel between the input and output of the first inverter, each of the field effect transistors having a gate electrode, the gate electrode of the first transistor adapted for coupling to a first voltage potential, the gate electrode of the second transistor being coupled to the output of the second inverter; first feedback means coupling the output of the second inverter to the first conductor thereby reinforcing a signal appearing on the first conductor; a third inverter having an input coupled to the second conductor and having an output; a fourth inverter having an input coupled to the output of the third inverter and having an output coupled to the gate electrode of the third transistor; fourth, fifth and sixth field effect transistors coupled in parallel between the input and output of the third inverter and each transistor having a gate electrode, the gate electrode of the fourth transistor adapted for coupling to the first voltage potential, the gate electrode of the fifth transistor being coupled to the output of the second inverter, and the gate electrode of the sixth transistor being coupled to the output of the fourth inverter; second feedback means coupling the output of the fourth inverter to the second conductor thereby reinforcing any signal appearing on the second conductor which is changing in a predetermined direction.

2. The speed-up circuit of claim 1 further including a first means coupled between the output of the second inverter and the second conductor to reinforce transition of the signal appearing on the second conductor, and second means coupled between the output of the fourth inverter and the first conductor to reinforce transition of the signal appearing on the first conductor.

3. The speed-up circuit of claim 1 wherein the first, second, third and fourth inverters each have a load device comprising a depletion mode field effect transistor.

4. The speed-up circuit of claim 1 wherein a first capacitor couples the first inverter to the first conductor, and a second capacitor couples the third inverter to the second conductor.

5. A speed-up circuit for sensing a voltage transition on a conductor and increasing rate of change of the transition, comprising: a first inverter having an input and an output, the input being coupled to the conductor; means coupled between the input and output of the first inverter for equalizing the input and output after a transition has been inverted; a second inverter coupled to the output of the first inverter and having an output which can have amplification over the transition sensed; and feedback means coupled between the output of the second inverter and the conductor for coupling the output of the second inverter to the conductor to reinforce the transition on the conductor.

6. A speed-up circuit for use with a digital memory array to speed-up transition of a bit sense signal, comprising: a first inverter having an input signal coupled to a bit sense line and providing an amplified output; first equalizing means coupled between the input and output of the first inverter to equalize the input and output following a transition; a second inverter having an input coupled to the output of the first inverter and providing an output; first feedback means coupling the output of the second inverter to the bit sense line to speed-up the transition; a third inverter having an input coupled to a complementary bit sense line and providing an amplified output; second equalizing means coupled between the input and output of the third inverter to equalize the input and output following a transition; a fourth inverter having an input coupled to the output of the third inverter and providing an output; and second feedback means coupling the output of the fourth inverter to the complementary bit sense line to speed-up the transition.

7. The speed-up circuit of claim 6 further including first means for coupling the output from the second inverter to the complementary bit sense line to speed-up the transition on the complementary bit sense line when the transition on the bit sense line is in a predetermined direction, and second means for coupling the output from the fourth inverter to the bit sense line when the transition on the complementary bit sense line is in the predetermined direction.

8. The speed-up circuit of claim 7 wherein the first and second means also invert the output of the second and fourth inverters respectively.

9. The speed-up circuit of claim 6 wherein the first and second equalizing means each have a first field effect transistor coupled between the input and output of the associated inverter and having their gate electrodes coupled to a first voltage potential terminal, the first and second equalizing means having at least another field effect transistor coupled in parallel with the first field effect transistor and each at least another field effect transistor having gate electrodes coupled to the output of the second and fourth inverters respectively.

10. The speed-up circuit of claim 6 wherein each inverter has a load device comprising a depletion mode field effect transistor.

11. The speed-up circuit of claim 6 wherein the first and second feedback means each have a depletion mode field effect transistor sharing an enhancement type field effect transistor load device.

12. The speed-up circuit of claim 6 wherein the first inverter is coupled to the bit sense line by a first capacitor and the third inverter is coupled to the complementary bit sense line by a second capacitor.

* * * * *